United States Patent [19]

Kobayashi

[11] 4,123,279
[45] Oct. 31, 1978

[54] LIGHT-SENSITIVE O-QUINONEDIAZIDE CONTAINING PLANOGRAPHIC PRINTING PLATE

[75] Inventor: Kesanao Kobayashi, Kanagawa, Japan

[73] Assignee: Fuji Photo Film Co., Ltd., Minami-ashigara, Japan

[21] Appl. No.: 756,653

[22] Filed: Jan. 4, 1977

Related U.S. Application Data

[63] Continuation of Ser. No. 561,762, Mar. 25, 1975, abandoned.

[30] Foreign Application Priority Data

Mar. 25, 1974 [JP] Japan .................. 49-33264

[51] Int. Cl.$^2$ .................. G03C 1/60; G03F 7/08
[52] U.S. Cl. .................. 96/91 D; 96/33; 96/49; 96/75; 96/115 R
[58] Field of Search .................. 96/91 D, 115 R, 75, 96/33

[56] References Cited

U.S. PATENT DOCUMENTS

| | | | |
|---|---|---|---|
| 3,046,120 | 7/1962 | Schmidt et al. | 96/91 D |
| 3,495,979 | 2/1970 | Laridon et al. | 96/91 D |
| 3,526,503 | 9/1970 | Dunham et al. | 96/91 D |
| 3,615,532 | 10/1971 | Silver | 96/75 |
| 3,644,118 | 2/1972 | Agnihotri | 96/115 R |
| 3,647,443 | 3/1972 | Rauner et al. | 96/91 D |
| 3,666,473 | 5/1972 | Colom et al. | 96/91 D |
| 3,759,711 | 9/1973 | Rauner et al. | 96/91 D |
| 3,782,939 | 1/1974 | Bonham | 96/115 R |
| 3,859,099 | 1/1975 | Petropoulos | 96/91 D |

FOREIGN PATENT DOCUMENTS

| | | | |
|---|---|---|---|
| 1,243,963 | 8/1971 | United Kingdom | 96/91 D |
| 1,251,345 | 10/1971 | United Kingdom | 96/91 D |

*Primary Examiner*—Charles L. Bowers, Jr.
*Attorney, Agent, or Firm*—Sughrue, Rothwell, Mion, Zinn and Macpeak

[57] ABSTRACT

A method for increasing the ink-receptivity of a light-sensitive planographic printing plate comprising a support having thereon a light-sensitive layer comprising an o-quinonediazide based light-sensitive material which is rendered alkali solution-soluble by irradiation of active light and a condensate of an aldehyde and a substituted phenol represented by the formula (I):

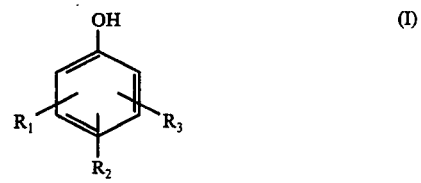

wherein $R_1$ and $R_2$ each is a hydrogen atom, an alkyl group, or a halogen atom, and $R_3$ is an alkyl group or a cycloalkyl group.

15 Claims, No Drawings

LIGHT-SENSITIVE O-QUINONEDIAZIDE CONTAINING PLANOGRAPHIC PRINTING PLATE

This is a continuation of application Ser. No. 561,762, filed Mar. 25, 1975, now abandoned.

BACKGROUND OF THE INVENTION

1. Field Of The Invention

The present invention relates to a method for increasing the ink-receptivity of a light-sensitive planographic printing plate. More particularly, the present invention relates to a method for increasing the ink-receptivity of a light-sensitive planographic printing plate having a positive type light-sensitive layer comprising an o-quinonediazide based light-sensitive material.

2. Description Of The Prior Art

In the planographic printing method the property that water and oil are substantially immiscible is skillfully utilized, and a planographic printing plate comprises areas which are receptive to water and repellant to greasy ink, and areas which are repellent to water and are receptive to greasy ink, i.e., the former areas being the non-image areas and the latter areas being the image areas. Thus, a light-sensitive composition as used in the planographic printing plate must be repellent to water and be receptive to the greasy ink after the formation of the image, and the higher such a property is, the more easily a print of good quality can be obtained.

Hitherto a developing ink has been coated on the image surface during plate-making after exposure to improve the ink receptive properties thereof (see *The Lithographic Manual*, published by The Graphic Arts Technical Foundation, Inc., pages 10:26 and 10:31).

Positive type light-sensitive planographic printing plates using o-quinonediazide based light-sensitive materials are described in, for example, Japanese patent publication No. 28,403/1968, U.S. Pat. Nos. 3,046,110, 3,046,111, 3,046,112, 3,046,115, 3,046,118, 3,046,119, 3,046,120, 3,046,121, 3,046,122, 3,046,123, 3,647,443, 2,772,972, 2,767,092, 2,766,118, 2,859,112, 2,907,655, 3,061,430, 3,102,809, and 3,106,465. It is well known that the light-sensitive material contains the following structural unit as a light-sensitive group in the molecule and is decomposed upon irradiation with actinic light, thereby forming an alkali solution-soluble group (see C. Süs, *Liebigs Annalen der Chemie*, Vol. 556, page 65 (1944)).

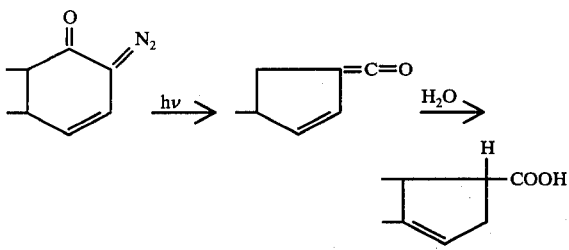

These o-quinonediazide based light-sensitive materials have excellent sensitivity, image-strength, stability with time, and the like, but their ink receptive properties are nearly equal those of a lacquer for a planographic and intaglio plate (non-blinding lacquer) (see *Chemistry of Lithography*, published by The Graphic Arts Technical Foundation Inc., #401, pages 173 to 174). Thus, if a developing ink is not coated on the image areas after development, blind due to a gum solution as used in a finishing step results. The term "blind" or "blinding" as used herein means that the ink receptive property of the image is reduced by a hydrophilic coating which is coated on the plate after development to protect the hydrophilic property of the non-image areas (in general, an aqueous solution of gum arabic is widely used). Thus, as described above, the image areas must be covered with the developing ink to prevent the blinding However, in accordance with this method, plate-making is complicated, a long period of time and a lot of labor are required for coating the developing ink, the designing of an automatic plate-making machine is made difficult, and an increase in cost results.

In using an o-quinonediazide based light-sensitive material as the light-sensitive layer of the planographic printing plate, a novolak type phenol resin is, as well known in the art, used as a binder. For example, the addition of an alkali-soluble phenol resin is described in German Pat. No. 888,204; U.S. Pat. Nos. 3,046,110, 3,046,116, 3,046,118, 3,046,123, etc. These light-sensitive materials can be developed with an alkali aqueous solution. Light-sensitive materials which can be developed with an aqueous solution are preferably used from the standpoint of cost, safety, pollution prevention, working environment, and the like. In general, a light-sensitive material is used in combination with the binder to improve the capabilities thereof, and as the binder, the alkali-soluble phenol resin as described in the above-described patents and shellac, rosin, and a styrene-maleic anhydride copolymer as described in U.S. Pat. No. 3,188,210, etc., are preferred for obtaining the advantages of development with an aqueous solution. As the phenol resin suitable for this purpose, those resins are preferred which are alcohol-soluble and are relatively easily soluble in alkali solution, and thus a phenol or cresol-formaldehyde resin is generally used. Phenol resin which are substituted with a large hydrophobic group can not be developed with an alkali aqueous solution. Thus, substituted phenol-aldehyde resins (hereinafter, those resins produced from substituted phenols and aldehydes as defined herein are referred to merely as "substituted phenol-aldehyde resins") are not suitable for development with the hitherto commercially used developers, e.g., an aqueous solution of sodium triphosphate as described in U.S. Pat. Nos. 3,046,110, 3,046,116, and 3,046,210. Planographic printing plates produced using a light-sensitive composition containing these substituted phenol-aldehyde resins can be developed with an alkali aqueous solution containing a small amount of an organic solvent, e.g., an aqueous solution prepared by adding several percent of an organic solvent such as benzyl alcohol, ethylene glycol monobutyl ether, or the like to JIS No. 3 sodium silicate.

U.S. Pat. No. 3,666,473 describes a photoresist composition prepared by adding an o-quinonediazide based light-sensitive material to a phenol-formaldehyde (novolak) resin which is insoluble in an alkali aqueous solution having a pH of about 12 or less and a phenol-formaldehyde (novolak or resol) resin which is rapidly soluble in an alkali aqueous solution having a pH of 12 or less. However, this composition is for a photoresist, and the object of this patent is to substantially reduce the exposure period. Thus, the requirement for the kind and property of the phenol-formaldehyde resin is principally limited to the solubility in the alkali aqueous solution and the requirement for the structure of each of compounds is not clear.

SUMMARY OF THE INVENTION

An object of the present invention is to provide a light-sensitive planographic printing plate which possesses the desired ink receptive property and is capable of forming an image which is free from blinding.

Another object of the present invention is to provide a light-sensitive planographic printing plate in which the ratio of water to ink can be controlled over a wide range to provide a print of good quality.

A further object of the present invention is to provide a light-sensitive planographic printing plate which has high printing durability.

These objects are attained with a planographic printing plate comprising a support having thereon a light-sensitive layer comprising an o-quinonediazide based light-sensitive material and a condensate of an aldehyde and a substituted phenol represented by the following formula (I):

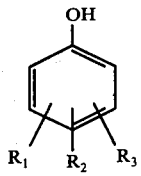
(I)

wherein $R_1$ and $R_2$ each is a hydrogen atom, an alkyl group containing 1 to 3 carbon atoms, or a halogen atom, and $R_3$ is an alkyl group containing 3 to 15 carbon atoms or a cycloalkyl group containing 3 to 15 carbon atoms.

DETAILED DESCRIPTION OF THE INVENTION

It has been found that a planographic printing plate containing a light-sensitive composition comprising an o-quinonediazide light-sensitive material and a substituted phenol-aldehyde resin can provide an image of markedly high ink receptive properties. When this plate, which is coated with a gum arabic solution of 14°Be after developing and is allowed to stand for one day, is used in printing, a print of sufficient ink density can be surprisingly obtained after only about 8 to 10 sheets of paper are printed. When hitherto used printing plates, in which a cresol-formaldehyde resin is used, are processed in the same manner as described above, a print of the same ink density can be obtained only after about 30 to 35 sheets of paper are wasted. More surprisingly, the printing durablility of the printing plate according to the present invention averages about 1.5 times the durability of the printing plate in which the cresol-formaldehyde resin is used. It is considered that this difference is based upon the difference in the ink receptive properties of the image areas.

The above-described disadvantage of the printing plate produced using the hitherto used light-sensitive composition comprising the o-quinonediazide light-sensitive material and the cresol-formaldehyde resin can be removed by adding a small amount of the substituted phenol-aldehyde resin. In this case, by adding the substituted phenol-aldehyde resin to the cresol-formaldehyde resin in a proportion of about 1 to 90%, preferably about 1 to 20% based upon the light-sensitive composition, a light-sensitive planographic printing plate can be obtained which can be developed with an alkali aqueous solution alone. Where the proportion of the substituted phenol-aldehyde resin is increased, the development can be conducted by adding a small amount of an organic solvent, a surface active agent, or the like to the alkali aqueous solution. Suitable examples of organic solvents include solvents such as benzyl alcohol, n-butyl alcohol, iso-butyl alcohol, tert-butyl alcohol, n-propyl alcohol, isopropyl alcohol, cyclohexanone, ethylene glycol monobutyl ether, ethylene glycol monopropyl ether, ethylene glycol monobutyl ether acetate, ethylene glycol monopropyl ether acetate, etc. The organic solvent can be employed in an amount of about 0.1 to 10% by weight, preferably 0.1 to 5% by weight. Suitable surface active agents include anionic surface active agents and nonionic surface active agents. Representative examples of anionic surfactants are, for example, aliphatic carboxylic acid salts, higher alcohol-sulfuric acid ester salts, aliphatic alcohol-phosphoric acid ester salts, dibasic fatty acid ester sulfonates, fatty acid amide sulfonates, alkylaryl-sulfonates, condensation products of formaldehyde and naphthalene sulfonates, etc. Representative examples of non-ionic surfactants are, for example, polyoxyethylene-alkali ethers, polyoxyethylene-alkylphenol ethers, polyoxyethylene-alkyl esters, sorbitan-alkyl esters, polyoxypropylene-polyoxyethylene ethers, etc. These surfactants can be used alone or in the form of a mixture of two or more. The amount thereof which can be used is not specifically limited, and a preferred range is about 10% by weight or less based on the total weight of the developer composition.

Substituted phenol-aldehyde resins for use in attaining the object of the present invention are produced by condensing substituted phenols represented by the following formula and aldehydes under acid conditions:

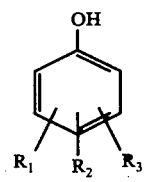
(I)

wherein $R_1$ and $R_2$ each is a hydrogen atom, an alkyl group (e.g., an alkyl group containing 1 to 3 carbon atoms such as methyl, ethyl, propyl and isopropyl, and an alkyl group containing 1 to 2 carbon atoms such as methyl and ethyl is particularly useful), or a halogen atom (e.g., fluorine, chlorine, bromine, and iodine, with chlorine and bromine being particularly preferred), and $R_3$ is an alkyl group (e.g., an alkyl group containing 3 to 15 carbon atoms, with an alkyl group containing 3 to 8 carbon atoms being particularly useful, such as an isopropyl, tert-butyl, tert-amyl, hexyl, tert-octyl, etc., group, particularly preferably a tert-butyl group), or a cycloalkyl group (e.g., a cycloalkyl group containing 3 to 15 carbon atoms with a cycloalkyl group containing 3 to 8 carbon atoms being particularly useful, such as a cyclohexyl, etc., group).

Representative examples of substituted phenols as used herein are isopropylphenol, t-butylphenol, t-amylphenol, hexylphenol, t-octylphenol, cyclohexylphenol, 3-methyl-4-chloro-tert-butylphenol, isopropylcresol, t-butylcresol, t-amylcresol, hexylcresol, t-octylcresol, cyclohexylcresol, and the like. The most preferred substituted phenols are tert-butylphenol and tert-butylcresol.

Examples of aldehydes as used herein are aliphatic or heterocyclic aldehydes containing 1 to 6 carbon atoms such as formaldehyde, paraformaldehyde, acetaldehyde, acrolein, crotonaldehyde, furfural, and the like. Preferred aldehydes are formaldehyde, paraformaldehyde, and acetaldehyde.

By reacting 7 moles of the substituted phenol and 6 moles or less of the aldehyde, e.g., preferably 5 to 6 moles of the aldehyde, a novolak resin can be obtained which is not cross-linked and is soluble in an alkali aqueous solution or an organic solvent. The novolak resin can be generally produced by condensing 1 mole of the substituted phenol and 0.85 mole of the aldehyde by heating at 25° to 170° C. under acid conditions.

The average molecular weight of the substituted phenol-aldehyde resins is preferably about 35 to 3,000, and those resins are preferred which are soluble in solvents such as aromatic hydrocarbons, e.g., toluene, xylene, and the like, ketones, e.g., acetone, methyl ethyl ketone, methyl isobutyl ketone, cyclohexane, and the like, chlorinated hydrocarbons, e.g., ethylene dichloride, and the like, ethers and glycol ethers, e.g., ethylene glycol monomethyl ether, ethylene glycol monoethyl ether, 2-methoxy ethyl acetate, dioxane, and the like, esters, e.g., ethyl acetate, butyl acetate, and the like, etc.

The amount of the substituted phenol-formaldehyde resin to be employed is about 1 to 300% by weight based upon the weight of the o-quinonediazide light-sensitive material, and is preferably about 1 to 100%, and most preferably 2 to 10%.

The o-quinonediazide light-sensitive materials as used herein produce a carboxylic acid upon irradiation with actinic light. Representative examples of o-quinonediazide light-sensitive materials are o-benzoquinonediazide, o-naphthoquinonediazide, and a quinolinequinonediazide type light-sensitive material, those which are an ester or amide compound produced by reacting a sulfochloride or an acid chloride and an aliphatic or an aromatic compound having a hydroxy group or an amino group. Representative compounds are a naphthoquinone-1,2-diazide(2)-5-sulfonic acid ester light-sensitive material of a pyrogallolacetone condensation resin as described in U.S. Pat. No. 3,635,709; a benzoquinone-1,2-diazide-(2)-4-sulfonamide light-sensitive material of 1-(p-aminophenylazo)-2-hydroxynaphthalene as described in U.S. Pat. No. 3,046,115; a naphthoquinone-1,2-diazide-(2)-5-sulfondodecylamide light-sensitive material as described in British Pat. No. 699,412; a benzoquinone-1,2-diazide-(2)-4-sulfonic acid diester light-sensitive material of 4,4'-dihydroxydiphenyl as described in U.S. Pat. No. 3,046,119; a naphthoquinone-1,2-diazide-(2)-5-sulfonic acid ester light-sensitive material of naphthol as described in U.S. Pat. No. 3,046,121; and the like. U.S. Pat. No. 3,046,121 describes a method of producing a light-sensitive material. In addition, positive type light-sensitive materials are useful which are commercially available as a photoresist. The proportion of the light-sensitive material contained in the light-sensitive composition particularly ranges from about 10 to 70% by weight and preferably ranges from about 15 to 50% by weight. In the present invention, it is preferred that a phenol-formaldehyde resin or cresol-formaldehyde resin is used simultaneously with the substituted phenol-formaldehyde resin and these resins can be added in a proportion of 89% by weight or less, with a preferred range being about 40 to 83% by weight. A suitable proportion of the substituted phenol-aldehyde resin ranges from about 1 to 90% by weight, preferably 1 to 20% by weight based on the light-sensitive composition.

Furthermore, if desired, a dye, a plasticizer, a print-out material, and the like can be employed to improve the capabilities of the light-sensitive composition. Likewise, additives which can be coated using the same solvent as that of the light-sensitive composition can be, if desired, employed.

For example, alcohol-soluble dyes for providing a visible image upon exposure and development can be employed. Suitable dyes are C.I. 26,105 (Oil Red RR), C.I. 21,260 (Oil Scarlet #308), C.I. 74,350 (Oil Blue), C.I. 52,015 (Methylene Blue), C.I. 42,555 (Crystal Violet), and the like. These dyes are employed in an amount sufficient for the color of the exposed hydrophilic surface of the support and that of the remaining areas of the light-sensitive layer to provide a clear contrast dye to the exposure and development of the light-sensitive printing plate of the present invention, and they are generally employed in a proportion of about 7% by weight or less based upon the total weight of the light-sensitive composition.

Abrasion resistance can be improved to some extent by employing an oleophilic polymer compound such as an epoxy resin, a vinyl chloride-vinyl acetate copolymer, polyvinylidene chloride, polyvinyl acetate, ethyl cellulose, acetylbutyl cellulose, and the like in the light-sensitive composition. Particularly, when acetylbutyl cellulose is used, the effect is significant. These oleophilic polymer compounds are employed in a proportion of about 8% by weight or less, preferably about 5% by weight or less based upon the total weight of the light-sensitive composition.

Also, a plasticizer can be employed in the light-sensitive composition. This plasticizer is effective in providing the desired flexibility to the light-sensitive layer provided on the support. For example, effective plasticizers include phthalic acid esters such as dimethyl phthalate, diethyl phthalate, dibutyl phthalate, diisobutyl phthalate, dioctyl phthalate, octylcapryl phthalate, dichlorohexyl phthalate, ditridecyl phthalate, butylbenzyl phthalate, diisodecyl phthalate, diaryl phthalate, and the like; glycol esters such as dimethyl glycol phthalate, ethyl phthalylethyl glycolate, methyl phthalylethyl glycolate, butyl phthalylbutyl glycolate, triethylene glycol diacrylic acid ester, and the like; phosphoric acid esters such as tricresyl phosphate, triphenyl phosphate, and the like; aliphatic dibasic acid esters such as diisobutyl adipate, dioctyl adipate, dimethyl sebacate, dibutyl sebacate, dioctyl azelate, dibutyl maleate, and the like; polyglycidyl methacrylate; triethyl citrate; glycerin triacetyl ester; butyl laurate; and the like.

These plasticizers are employed in a proportion of about 5% by weight or less based on the total weight of the light-sensitive composition.

To immediately obtain a visible image by exposing the light-sensitive planographic printing plate of the present invention, those spiropyran compounds which change in color by exposure can be employed in the light-sensitive composition such as 6-nitrobenzoindolinospiropyran, 1,3,3-trimethylindolino-8'-methoxy-6'-nitrobenzospiropyran, 6'-nitro-1,3,3-trimethylindolinobenzospiropyran, 1,3,3-trimethylindolinobenzospiropyran, 1,3,3-trimethylindolino-β-naphthospiropyran, benzo-β-naphthospiropyran, xantho-β-benzospiropyran, 6'-nitro-1,3,3-trimethylspiro(indolin-2,2'-2'H- chromene), 8'-formyl-1,3,3-trimethylspiro(indolin-2,2'-2'H-chromene), 6',8'-dichloro-1,3,3-trimethylspiro(indolin-2,2'-2'H-chromene), and the like. These compounds are employed in an amount of about 2 to 20% by weight based upon the weight of the light-sensitive composition.

Supports as used herein are dimensionally stable plates. These dimensionally stable plates include those plates which have been hitherto used as a support for a printing plate. As the support, paper, synthetic resin (for example, polyethylene, polypropylene, polystyrene, and the like) laminated papers, metal plates such as plates of aluminum (including aluminum alloys), zinc, copper, and the like, synthetic resin films such as films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, and the like, papers or synthetic resin films laminated or deposited with the above-described metals, and the like can be used. Of these supports, an aluminum plate is particularly preferred in that it is markedly dimensionally stable and inexpensive. Furthermore, a composite sheet in which an aluminum sheet is bonded onto a polyethylene terephthalate film, as described in Japanese patent publication No. 18,327/1973, is also preferred.

The surface of the support should be hydrophilic. In the present invention, the term "hydrophilic surface" designates a contact angle of 120° or less.

This hydrophilic surface can be provided by various methods. For example, in the case of supports having a synthetic resin surface, a so-called surface treatment, e.g., a chemical treatment, a corona discharge treatment, a flame treatment, an ultraviolet light treatment, a high-frequency wave treatment, a glow discharge treatment, an active plasma treatment, a laser treatment, and the like, as described in U.S. Pat. Nos. 2,764,520, 3,497,407, 3,145,242, 3,376,208, 3,072,483, 3,475,193, 3,360,448; British Pat. No. 788,365, etc., and a method comprising providing an under-coating layer on the synthetic resins after applying a surface treatment can be used.

Suitable coating methods are, for example, a multilayer method in which a hydrophobic resin layer which adheres well to the synthetic resins and is quite soluble, is coated as a first layer and a hydrophilic resin layer is provided as a second layer; and a single layer method in which a layer of a synthetic resin having a hydrophobic group and a hydrophilic group in the same polymer is coated.

With supports having a metal surface, particularly an aluminum surface, a surface treatment such as a graining treatment, a dipping treatment using an aqueous solution of sodium silicate (e.g., as disclosed in U.S. Pat. No. 2,714,066), potassium fluorozirconate (e.g., as disclosed in U.S. Pat. No. 2,946,683), phosphoric acid salts (e.g., as disclosed in U.S. Pat. No. 3,148,984), and the like, or an anodic oxidation treatment (e.g., as disclosed in British Pat. No. 781,814), is preferably employed. In addition, an aluminum plate which is dipped in an aqueous solution of sodium silicate after grained as described in U.S. Pat. No. 2,714,066, and an aluminum plate which is dipped in an aqueous solution of an alkali metal silicate after an anodic oxidation treatment as described in U.S. Pat. Nos. 3,181,461 and 3,280,734 are preferably used. The above-described anodic oxidation is conducted by passing a current through an electrolyte comprising one or more of an inorganic acid, e.g., phosphoric acid, chromic acid, sulfuric acid, boric acid, and the like, an organic acid, e.g., oxalic acid, sulfamic acid, and the like, as an aqueous or non-aqueous solution thereof, with the aluminum plate as an anode.

Also, a silicate electro-deposition as described in U.S. Pat. No. 3,658,662 is effective.

These treatments to render the surface hydrophilic are employed to prevent adverse reactions between the surface of the support and the light-sensitive composition provided thereon, and to improve the adhesion between the surface of the support and the light-sensitive layer in addition to rendering the surface of the support hydrophilic. Particularly, in the case of an aluminum support, the surface is sufficiently hydrophilic (a contact angle of about 110°) without applying any treatment to render the surface hydrophilic, and thus such a treatment is employed mainly to prevent adverse reactions between the support and the light-sensitive composition and to improve the adhesion between the support and the light-sensitive layer.

Light-sensitive compositions comprising the above-described ingredients are dissolved in a suitable solvent and coated on the above-described hydrophilic surface of the support. Suitable solvents are glycol ethers such as ethylene glycol monomethyl ether, ethylene glycol monoethyl ether, 2-methoxyethyl acetate, and the like, ketones such as acetone, methyl ethyl ketone, cyclohexanone, and the like, chlorinated hydrocarbons such as ethylenedichloride, and the like, etc.

The solutions as prepared above can be coated using hitherto known methods, for example, dip coating, air knife coating, bead coating, curtain coating, extrusion coating using a hopper as described in U.S. Pat. No. 2,681,294, and the like.

The amount of the light-sensitive composition of the present invention coated on the support is suitably about 0.5 to 7.0 g/m$^2$, and preferably about 1.5 to 3.0 g/m$^2$, of the support.

When the light-sensitive planographic printing plate of the present invention is exposed through a transparent positive film with light rich in active light of a carbon arc lamp, a mercury lamp, a xenon lamp, a tungsten lamp, etc., the exposed areas become alkali-soluble. Thus, when the exposed plate is dipped in an alkali aqueous solution of sodium silicate, sodium phosphate, and the like, or an alkali aqueous solution further containing an organic solvent, e.g., benzyl alcohol, ethylene glycol monobutyl ether, and the like, or a surface active agent, or the like, the exposed areas are dissolved and removed, and the non-exposed areas alone are left on the surface of the support as a positive image.

When the thus-prepared plate is placed on a printing machine after washing and printing is conducted in accordance with known methods, the thus-produced plate can be used as a printing plate which has markedly excellent ink receptive properties and produces only a small amount of wasted paper until sufficient density is obtained.

The present invention will be explained in greater detail by reference to the following examples. Unless otherwise indicated, all parts, percents, ratios and the like are by weight.

EXAMPLE 1

A 2S aluminum plate, which was mechanically grained in accordance with the method as described in U.S. patent application Ser. No. 284,851, filed Aug. 30, 1972, was dipped in a 2% aqueous solution of sodium hydroxide maintained at 40° C. for 1 minute to etch a part of the surface thereof. After washing, the aluminum plate was dipped in a mixed solution of sulfuric acid and chromic acid for about 1 minute to expose the surface of pure aluminum. Then the plate was dipped in a 20% sulfuric acid aqueous solution maintained at 30° C. and an anodic oxidation was conducted under the conditions of a D.C. voltage of 1.5 V and a current density of $3A/dm^2$ for 2 minutes. The aluminum plate was then washed and dried.

On the thus-prepared aluminum plate, a light-sensitive solution of the following composition was continuously coated using a roll coater in a dry weight of about 2 $g/m^2$.

|  | Quantity (g) |
|---|---|
| Naphthoquinone-1,2-diazide(2)-5-sulfonic Acid Ester of Acetone-Pyrogallol Resin (produced by the method as described in Example 1 of U.S. Pat. No. 3,635,709) | 5 |
| PR-50530 (tert-butylphenol-formaldehyde resin, melting point of 62-72° C, viscosity of 10 g in 1000 ml ethanol of 1.85-2.10, produced by Sumitomo-Durez Co., Ltd.) | 0.5 |
| Hitanol #3110 (cresol-formaldehyde resin, melting point of 105° C, produced by Hitachi Kasei Industry Co.) | 5 |
| Methyl Ethyl Ketone | 50 |
| Cyclohexanone | 40 |

The plate, which was dried at 100° C. for 2 minutes, possessed the capability of a presensitized (PS) plate, and where the plate was stored in a cold and dark place, its capability was satisfactory when used even after one year.

The thus-prepared light-sensitive planographic printing plate was exposed for 30 seconds through a transparent positive film to a Fuji Film PS Light (produced by the Fuji Photo Film Co., Ltd., and having a Toshiba Metal Halide Lamp MU 2000-2-OL Type 3 KV as a light source) at a distance of 1 m in a vacuum printing frame. Subsequently, the plate was dipped in a developer having the following composition to effect development.

|  | Quantity (g) |
|---|---|
| JIS No. 3 Sodium Silicate | 10 |
| Aerosol OS (isopropylnaphthalene sulfonic acid sodium salt produced by American Cyanamide Co.) | 20 |
| Benzyl Alcohol | 30 |
| Water to make | 1000 ml |

After washing the plate, a gum arabic solution of 14°Bé, for example, #63 gum produced by the Fuji Photo Film Co., Ltd., was coated on the surface of the plate and buff-dried. The thus-produced printing plate, after storage for 3 days, was mounted on Heidelberg GTO type printing machine to effect printing. Prior to the printing, ink was uniformly coated on each ink roll, and when the ink was contacted with the surface of the plate, feeding of paper was begun. The ink receptive property of the plate was determined by measuring how many sheets of paper were wasted until a print was obtained which had the same ink density as that of the 100th print. With this printing plate, the 6th to 8th possessed the same ink density as that of the 100th print. However, with a printing plate produced using the same light-sensitive composition as described above except that the tert-butylphenol-formaldehyde resin was excluded, 15 to 20 sheets of paper were wasted until the same ink density as that of the 100th print was obtained.

Furthermore, when the printing durabilities of the two plates were compared, it was found that with the printing plate produced by the method of the present invention, about 200,000 sheets of uniform print were obtained, while with the latter printing plate, a partial reduction in ink density began when about 150,000 sheets were printed. However, when about 150,000 sheets were printed, the degree of abrasion of the image in both of the printing plates was of the same order. The fact that the number of the prints was different in both cases, is considered to be based upon the superiority of the printing plate of the present invention in ink receptive property.

EXAMPLE 2

A 3S aluminum plate was mechanically grained by the method as described in U.S. Patent application Ser. No. 284,851, filed Aug. 30, 1972, washed with flowing water, and then dried. Next, a light-sensitive solution of the following composition was coated on the aluminum plate using a whirler, and dried at 100° C. for 2 minutes. The amount coated was about 2 $g/m^2$.

|  | Quantity (g) |
|---|---|
| Naphthoquinone-1,2-diazide(2)-5-sulfonic Acid Ester of Acetone-Pyrogallol Resin | 5 |
| PR-50530 (tert-butylphenol-formaldehyde resin as described in Example 1) | 5 |
| Ethylene Glycol Monomethyl Ether | 150 |

The thus-produced light-sensitive planographic printing plate was exposed for 60 seconds through a transparent positive film to a Fuji Film PS Light at a distance of 1 m in a vacuum printing frame. The development was effected in the same manner as in Example 1, and printing was effected in the same manner as in Example 1. The 5th to 6th print possessed the same ink density as that of the 100th print.

EXAMPLE 3

A 3S aluminum plate was mechanically coarsened, washed with distilled water, dipped in a 10% $NH_4.HF_2$ aqueous solution for 1 minute, and washed again with distilled water. Then, the aluminum plate was subjected to anodic oxidation in a 68% phosphoric acid solution at 25° C. using a current density of 15 amperes, washed with distilled water, and then dried. A 0.05% aqueous solution of PAM-200, i.e., a high molecular weight polyacrylamide produced by American Cyanamide Co., was coated using a roll coater and dried at 120° C. for 2 minutes. Then a light-sensitive solution of the following composition was coated on the plate.

|  | Quantity (g) |
|---|---|
| Naphthoquinone-1,2-diazide(2)-5-sulfonic Acid Ester of β-Naphthol | 1 |
| PP-3007 (tert-butylphenol-formaldehyde | 0.05 |

-continued

| | Quantity (g) |
|---|---|
| resin, melting point of 83° C, produced by Gunei Kagaku Kogyo Co.) | |
| MP-703 (cresol-formaldehyde resin, produced by Gunei Kagaku Kogyo Co.) | 2 |
| Ethylene Glycol Monomethyl Ether | 100 |

The solution was coated in a dry weight of 3 g/m² and dried at 100° C. for 2 minutes. The plate was wrapped in an aluminum coated kraft paper and stored in a cool and dark place. The plate was unwrapped after 3 months and exposed for 30 seconds to a Fuji Film PS Light at a distance of 1 m.

The plate was dipped in a developer at room temperature (i.e., about 20° - 30° C.) for 30 seconds and developed by scrubbing the surface gently with absorbent cotton. After washing, water on the surface of the plate was removed, and a gum arabic solution of 14° Bé was coated all over the plate and buff-dried.

The thus-prepared printing plate was mounted on Harris Auralia printing machine. After ink was sufficiently coated all over the ink roll, the gum remaining on the surface of the plate was removed using a sponge impregnated with water, and the entire surface of the plate was wet with an etching solution (# 60 Etching Solution produced by the Fuji Photo Film Co., Ltd.), the machine was started. Simultaneously with the starting of the printing machine, paper was fed and it was found that the ink density of the 5th to 6th print corresponded to that of the 100th print.

On the other hand, a plate was produced using a solution of the same composition as used above except that PP-3007 was replaced with MP-703, and this plate was processed in the same manner as described above. With this plate, about 20 sheets were printed until a print having the same ink density as the 100th print was obtained. From this result, it is apparent that PP-3007 improves the ink receptive property of the image areas.

EXAMPLE 4

On an aluminum plate which was treated in the same manner as described in Example 2, a light-sensitive solution of the following composition was coated.

| | Quantity (q) |
|---|---|
| Naphthoquinone-1,2-diazide(2)-5-sulfonic Acid Diethyl Ester of Bisphenol A | 0.8 |
| PP-3007 (tert-butylphenol-formaldehyde resin produced by Gunei Kagaku Kogyo Co.) | 0.05 |
| MP-703 (cresol-formaldehyde resin, produced by Gunei Kagaku Kogyo Co.) | 2 |
| Rhodamine B Base (C.I. Solvent Red 49) | 0.15 |
| Methyl Ethyl Ketone | 30 |
| 2-Methoxyethyl Acetate | 30 |

A transparent positive film was superposed on the completely red colored plate in such a manner that the film was in contact with the light-sensitive layer, and exposure was applied for 2 minutes using a 30 ampere (5 V) carbon arc lamp at a distance of 70 cm. This plate was dipped in a developer comprising 100 g of JIS No. 1 sodium silicate, 10 g of sodium hydroxide, and 1000 ml of pure water for 1 minute and then the non-image areas were removed by scrubbing gently the surface of the plate. The image areas turned pink in color, and thus the plate provided an image which had markedly high contrast and was clear. Printing was conducted in the same manner as in Example 1, and 8 sheets were wasted until a print having the same ink density as the 100th print was obtained.

While the invention has been described in detail and with reference to specific embodiments thereof, it will be apparent to one skilled in the art that various changes and modifications can be made therein without departing from the spirit and scope thereof.

What is claimed is:

1. A positive-working light-sensitive planographic printing plate capable of providing a useful print on paper after about 8 to 10 sheets of printing when said plate is coated after development with gum arabic solution of 14° Be, and then stored for about a period of one day, comprising a support having thereon a light-sensitive layer containing in admixture a o-quinonediazide light-sensitive material which becomes alkali solution-soluble upon irradiation with actinic light selected from the group consisting of an ester of an amide compound of o-benzoquinonediazide, o-naphthaquinonediazide, quinolinequinonediazide which comprises adding to the light-sensitive layer
    (a) about 15 to 50% by weight of said o-quinonediazide light-sensitive material,
    (b) about 1 to 20% by weight of an organic solvent soluble novolak resin produced by the condensation of an aldehyde and tertbutyl phenol, and
    (c) about 40 to 83% by weight of an alkali-solution soluble phenol-formaldehyde resin or an alkali-solution soluble cresol-formaldehyde resin, each percent by weight being based on the weight of said light-sensitive layer, components (a), (b) and (c) being present in said light-sensitive layer in admixture.

2. The printing plate according to claim 1, wherein the aldehyde is selected from the group consisting of formaldehyde, paraformaldehyde, acetaldehyde, acrolein, crotonaldehyde, and furfural.

3. The printing plate according to claim 1, wherein the novolak resin is present in an amount of about 1 to 300% by weight based upon the weight of the o-quinonediazide light-sensitive material.

4. The printing plate according to claim 3, wherein the novolak resin is present in an amount of about 1 to 100% by weight based upon the weight of the o-quinonediazide light-sensitive material.

5. The printing plate according to claim 1, wherein the light-sensitive layer additionally contains at least one of a dye, a plasticizer, and a printout material.

6. The printing plate according to claim 1, where said aldehyde is formaldehyde.

7. The printing plate according to claim 1, wherein said organic solvent soluble novolak resin is a non-cross-linked organic solvent soluble novolak resin.

8. The printing plate according to claim 1, wherein the molecular weight of said organic solvent soluble novolak resin is from about 35 to about 3000.

9. The printing plate according to claim 8, wherein said organic solvent is an aromatic hydrocarbon.

10. The printing plate according to claim 8, wherein said organic solvent is a chlorinated hydrocarbon.

11. The printing plate according to claim 8, wherein said organic solvent is a ketone.

12. The printing plate according to claim 8, wherein said organic solvent is an ether.

13. The printing plate according to claim 8, wherein said organic solvent is a glycol ether.

14. The printing plate according to claim 8, wherein said organic solvent is an ester.

15. The printing plate according to claim 8, wherein said organic solvent is selected from the group consisting of toluene, xylene, acetone, methylethyl ketone, methylisobutylketone, cyclohexane, ethylenedichloride, ethylene glycol monomethyl ether, ethylene glycol monoethyl ether, 2-methoxyethylacetate, dioxane, ethylacetate and butylacetate.

* * * * *